(12) United States Patent
Leroy et al.

(10) Patent No.: US 10,063,163 B2
(45) Date of Patent: Aug. 28, 2018

(54) ACTUATOR FOR AN ULTRASONIC MOTOR AND ULTRASONIC MOTOR COMPRISING AT LEAST ONE SUCH ACTUATOR

(71) Applicant: Commissariat à l'énergie atomique et aux énergies alternatives, Paris (FR)

(72) Inventors: Edouard Leroy, Paris (FR); Moustapha Hafez, Arcueil (FR); José Lozada, NY Via a Lumbisi (EC)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 484 days.

(21) Appl. No.: 14/407,302

(22) PCT Filed: Jun. 13, 2013

(86) PCT No.: PCT/EP2013/062266
§ 371 (c)(1),
(2) Date: Dec. 11, 2014

(87) PCT Pub. No.: WO2013/186308
PCT Pub. Date: Dec. 19, 2013

(65) Prior Publication Data
US 2015/0162853 A1  Jun. 11, 2015

(30) Foreign Application Priority Data
Jun. 15, 2012  (FR) ...................................... 12 55649

(51) Int. Cl.
*H02N 2/10* (2006.01)
*H01L 41/09* (2006.01)
*H02N 2/00* (2006.01)

(52) U.S. Cl.
CPC .......... *H02N 2/108* (2013.01); *H01L 41/0906* (2013.01); *H02N 2/003* (2013.01); *H02N 2/103* (2013.01); *H02N 2/007* (2013.01)

(58) Field of Classification Search
CPC ........ H02N 2/108; H02N 2/003; H02N 2/103; H02N 2/001; H01L 41/0906
(Continued)

(56) References Cited

U.S. PATENT DOCUMENTS 5,453,653 A * 9/1995 Zumeris .............. H01L 41/0913
310/315
2004/0080243 A1* 4/2004 Miyazawa ............. H02N 2/004
310/328

(Continued)

FOREIGN PATENT DOCUMENTS

DE  10-2009-039-922 A1  11/2010
GB  2 458 905 A  10/2009

(Continued)

OTHER PUBLICATIONS

Chunsheng Zhao et al., "Ultrasonic Motors, Technologies and Applications" 1st Edition, Springer-Verlag, Berlin and Heidelberg GmbH & Co, 2011.

(Continued)

*Primary Examiner* — Bryan Gordon
(74) *Attorney, Agent, or Firm* — Pearne & Gordon LLP

(57) ABSTRACT

An ultrasonic motor comprising a rotor (18) having an at least partly spherical shape and two actuators (2, 2') each comprising an element of plate-shaped piezoelectric material comprising at least one contact edge (4, 4') in contact with the rotor (18), said actuators (2, 2') also comprising on one of their faces electrodes intended to bias piezoelectric materials in a bending mode and in a longitudinal mode. The contact edges (4, 4') are concave and are formed by an arc (Continued)

of circle the radius of which substantially corresponds to the radius of the surface of the rotor (18), said arcs of circle angularly extending at a determined angle such that the bending mode and the longitudinal mode in which the piezoelectric material is biased are at the same frequency.

20 Claims, 5 Drawing Sheets

(58) Field of Classification Search
USPC ............... 310/323.02, 323.16, 328, 367, 368
See application file for complete search history.

(56) References Cited

U.S. PATENT DOCUMENTS

| | | | | |
|---|---|---|---|---|
| 2006/0049720 | A1* | 3/2006 | Henderson | G02B 7/102 310/328 |
| 2008/0106170 | A1* | 5/2008 | Knowles | H01L 41/0993 310/328 |
| 2008/0247059 | A1* | 10/2008 | Dong | G02B 7/102 359/696 |
| 2009/0039735 | A1* | 2/2009 | Nitto | H01L 41/0471 310/323.02 |
| 2009/0256445 | A1* | 10/2009 | Kotani | H02N 2/003 310/323.16 |
| 2010/0207488 | A1* | 8/2010 | Ting | H02N 2/16 310/323.06 |
| 2011/0050035 | A1 | 3/2011 | Wischnewskiy | |
| 2012/0293043 | A1 | 11/2012 | Takano | |
| 2013/0051781 | A1 | 2/2013 | Kobayashi et al. | |
| 2013/0151960 | A1 | 6/2013 | Wiertlewski | |
| 2015/0169060 | A1 | 6/2015 | Hudin | |

FOREIGN PATENT DOCUMENTS

| | | |
|---|---|---|
| JP | H07-21115 U | 4/1995 |
| JP | H07-194152 A | 7/1995 |
| JP | H08-70589 A | 3/1996 |
| JP | H11-346486 A | 12/1999 |
| JP | 2005-033989 A | 2/2005 |
| JP | 2009-284759 A | 12/2009 |
| JP | 2011-166901 A | 8/2011 |
| SU | 851560 B | 7/1981 |
| WO | 2010/121594 A1 | 10/2010 |
| WO | 2011/093306 A1 | 8/2011 |
| WO | 2011/113505 A1 | 9/2011 |

OTHER PUBLICATIONS

Guo Kang et al., "Motion mechanism analysis of a two-degree-of-freedom spherical motor" Information Engineering and Computer Science, 2010.

Masahiko Hoshina et al., "Development of Pipe Inspection Robot; Driving System and Control of Outer-rotor-typed Spherical Ultrasonic Motor" Advanced Robotics, International Conference on ICAR, 2009.

K. Takemura et al., "Design of a Plate Type Multi-DOF Ultrasonic Motor and Its Self-Oscillation Driving Circuit" IEEE/ASME Transactions on Mechatronics, vol. 9, No. 3, Sep. 2004.

Sheng-Chih Shen et al., "Design and Fabrication of a High-Power Eyeball-Like Microactuator Using a Symmetric Piezoelectric Pusher Element" Journal of Microelectromechanical Systems, vol. 19, No. 6, Dec. 2010.

Masahiro Takano et al., "Electrode design of multilayered piezoelectric transducers for longitudinal-bending ultrasonic actuators" Acoustical Science and Technology, vol. 32, No. 3, 2011.

P. Vasiljev et al., "Modelling and analysis of omni-directional piezoelectric actuator" Journal of Sound and Vibration, vol. 308, 2007.

Yung Ting et al., "Stator Analysis and Design of a Spherical Piezoelectric Motor" Proceedings of the 2009 IEEE International Conference on Robotics and Biomimetics, Dec. 2009.

Zhang Minghui et al., "A multi-degree-of-freedom ultrasonic motor using in-plane deformation of planar piezoelectric elements" Sensors and Actuators A: Physical, vol. 148, No. 2008.

U.S. Appl. No. 14/408,771, "Actuator with Hybrid Actuation for a Force Feedback Interface" filed Dec. 17, 2014.

Li Shiyang et al. "Design and Optimization of a Novel Annular Sector Curvilinear Ultrasonic Motor" Ultrasonics Symposium, Nov. 2, 2008.

Li et al "Particle Swarm Optimization Combined with Finite Element Methof for Design of Ultrasonic Motors", Sensors and Actuators; vol. 148, No. 1, Nov. 4, 2008.

Search Report issued in French Application No. 12 55649 dated Mar. 14, 2013.

International Preliminary Report on Patentability issued in Application No. PCT/EP2013/062266 dated Oct. 13, 2014.

International Search Report issued in Application No. PCT/EP2013/062266 dated Sep. 2, 2013.

Written Opinion issued in Application No. PCT/EP2013/062266 dated Sep. 2, 2013.

Office Action issued in Patent Application No. JP 2015-516616 dated Mar. 30, 2017.

* cited by examiner

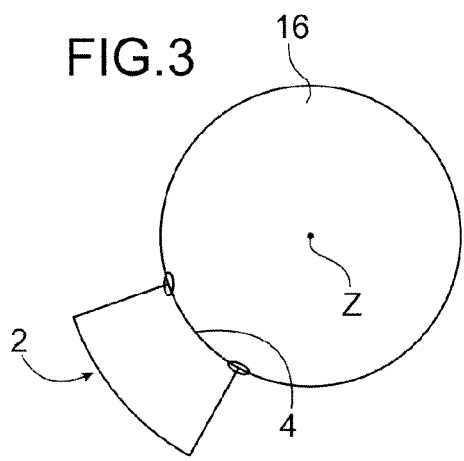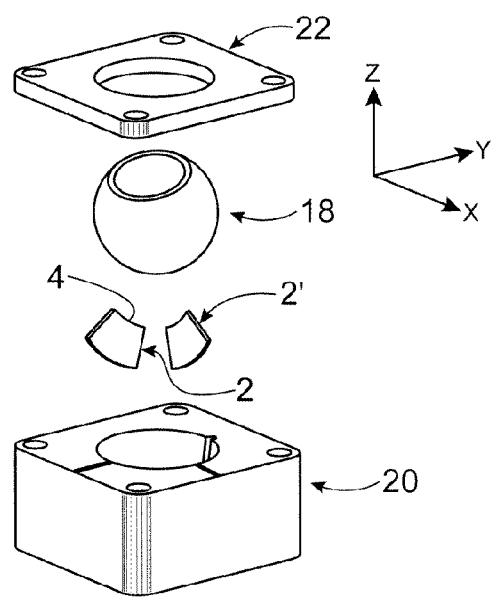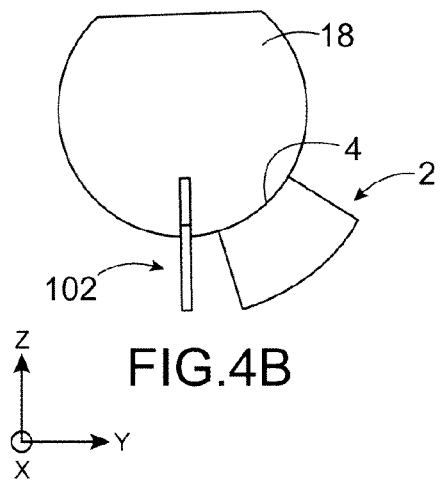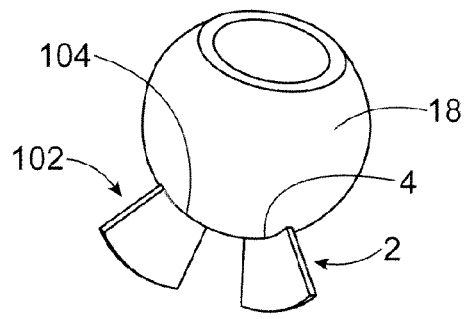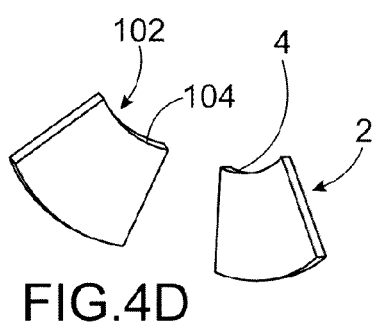

ACTUATOR FOR AN ULTRASONIC MOTOR AND ULTRASONIC MOTOR COMPRISING AT LEAST ONE SUCH ACTUATOR

TECHNICAL FIELD AND PRIOR ART

The present invention relates to an actuator for an ultrasonic motor and an ultrasonic motor comprising at least one such actuator.

Ultrasonic actuators are actuators with one or more degrees of freedom used in numerous fields. They have a reduced weight and a great compactness.

Ultrasonic motors implement actuators of piezoelectric material which are provided in the stator which, when an A. C. voltage is applied thereto, start vibrating. The shape of the actuators and the A. C. voltage signal are determined so as to generate an elliptical movement which, when applied to a cylindrical or spherical rotor, rotatably drives it about a given axis.

The elliptical movement can be achieved by combining a longitudinal mode and a bending mode.

A motor using such a movement is for example described in document M. Zhang, W. Guo, and L. Sun, "*A multi-degree-of-freedom ultrasonic motor using in-plane deformation of planar piezoelectric elements*", Sensors and Actuators A: Physical, vol. 148, no. 1, p. 193-200, November 2008. The motor comprises four linear actuators arranged in parallel, each formed by a plate of piezoelectric material covered with four electrodes on one face and one electrode on the other face. The four plates are attached to a rectangular parallelepiped shaped casing pierced with a port acting as a housing for the rotor formed by a sphere. Vibrating the housing of the rotor causes the rotor to rotate.

This actuator has a significant overall space.

There are also ultrasonic motors wherein the actuators are in contact with the rotor through a tip.

But this contact results in localizing the stresses, which can reduce the lifetime of the motor. Such a motor is for example described in document Sheng-Chih Shen and Juin-Cherng Huang, "*Design and Fabrication of a High-Power Eyeball-Like Microactuator Using a Symmetric Piezoelectric Pusher Element*", Microelectromechanical Systems, Journal of, vol. 19, no. 6, p. 1470-1476, 2010.

DISCLOSURE OF THE INVENTION

Consequently, one purpose of the present invention is to provide an actuator allowing an ultrasonic motor having a reduced overall space and offering an increased lifetime to be made.

The previously set forth purpose is achieved by an actuator of piezoelectric material provided with a curved contact area intended to contact the rotor, the actuator comprising electrodes to stimulate the bending mode and the longitudinal mode so as to generate an elliptical movement and rotate the rotor.

By virtue of this curved contact area formed by an arc of circle the radius of which substantially corresponds to the radius of the rotor, this actuator offers a great contact area with the rotor which enables a better distribution of the stress within the actuator and thus a reduction of the risk of occurrence of beginning localized cracks that can result in the actuator bursting as well as wear of the contact surface which deteriorates the performances. Besides, by virtue of this shape, the manufacture of the motor is simplified because it allows to composite for possible clearances for placing the rotor on the actuator the contact edge of which forms a cradle, in particular in the case of small sized motors. At least two contact points are ensured. Besides, the cradle thus formed provides for a rotor guide.

The use of constructive elliptical movements throughout the actuator improves the actuator efficiency by increasing the useful part of the electrical energy sent to the actuator. Thus, several contact points performing elliptical movements in the same direction can each transmit a mechanical energy part, as a result there is a greater transmitted mechanical energy than in the case of a single contact point.

Advantageously, the contact area is covered with a material reducing the abrasive wear of the piezoelectric ceramics, for example an epoxy resin.

The actuator according to the invention offers a reduced stator volume/rotor volume ratio with respect to the actuators of the state of the art, thus it has a greater compactness.

The subject-matter of the invention is an actuator for an ultrasonic motor comprising an element of plate-shaped piezoelectric material comprising at least one contact edge provided with at least one contact area intended to contact a rotor of the ultrasonic motor, electrodes intended to bias the piezoelectric material in a bending mode and in a longitudinal mode, wherein the contact edge is concave and is formed by a first arc of circle having a first radius, said first arc of circle extending angularly at a determined angle such that the bending mode and the longitudinal mode in which the piezoelectric material is biased are at the same frequency, and said at least one contact area is concave and is carried by a second arc of circle having a second radius substantially corresponding to the radius of the surface of the rotor which is intended to contact the actuator.

Preferably, the actuator comprises two contact areas. In an exemplary embodiment, the contact area(s) is (are) projecting from the contact edge, the contact area(s) being of a material different from the piezoelectric material, said material ensuring a reduced abrasive wear of the element of piezoelectric material and of the rotor.

In another exemplary embodiment, the first radius of the first arc of circle forming the contact edge and the second radius of the arc of circle forming the contact area(s) are equal such that the actuator contacts the rotor through its contact edge. Advantageously, the actuator comprises a layer covering the contact edge, of a material different from the piezoelectric material, said material offering a reduced abrasive wear of the element of piezoelectric material and of the rotor.

For example, the material different from the piezoelectric material providing a reduced abrasive wear of the element of piezoelectric material and of the rotor is an epoxy resin.

The actuator can comprise three other sides, the opposite edge to the contact edge being convex and being formed by a second arc of circle.

Preferably, the first and second arcs of circle are coaxial.

The actuator can comprise four vertices and the number of electrodes intended to bias a piezoelectric material in a bending mode is four and they are each located at a vertex of the actuator and the electrode intended to bias the piezoelectric material in a longitudinal mode substantially forms a cross between the four electrodes intended to bias the piezoelectric material in a bending mode.

Preferably, the difference between the second radius and the first radius is between 0.5 mm and 1 mm.

Another subject-matter of the present invention is also an ultrasonic motor comprising at least one actuator according to the invention forming a stator and a rotor the external surface of which is in contact with said contact area of said actuator. The ultrasonic motor can have one degree of freedom and comprise a single actuator.

In another exemplary embodiment, the ultrasonic motor has at least two degrees of freedom, at least two actuators and a rotor having an external surface being at least partly spherical.

The ultrasonic motor can comprise a support for each of the actuators and means for connecting the electrodes to an A. C. voltage source, each support holding the actuator at its edges other than the contact edge.

In an exemplary embodiment, the housing comprises bosses in contact with the edges of the actuator which are other than the contact edge at the areas of the edges of the actuator which have a null bending displacement.

Advantageously, the rotor is of aluminium.

BRIEF DESCRIPTION OF THE DRAWINGS

The present invention will be better understood using the description that follows and the appended drawings wherein:

FIG. 3 is a schematic representation of an ultrasonic motor having one degree of freedom comprising an actuator according to the present invention, FIG. 4A is an exploded view of an ultrasonic motor having two degrees of freedom comprising two actuators according to the present invention, FIGS. 4B to 4D are detail views of the motor of FIG. 4A.

DETAILED DISCLOSURE OF PARTICULAR EMBODIMENTS

Figure 1:
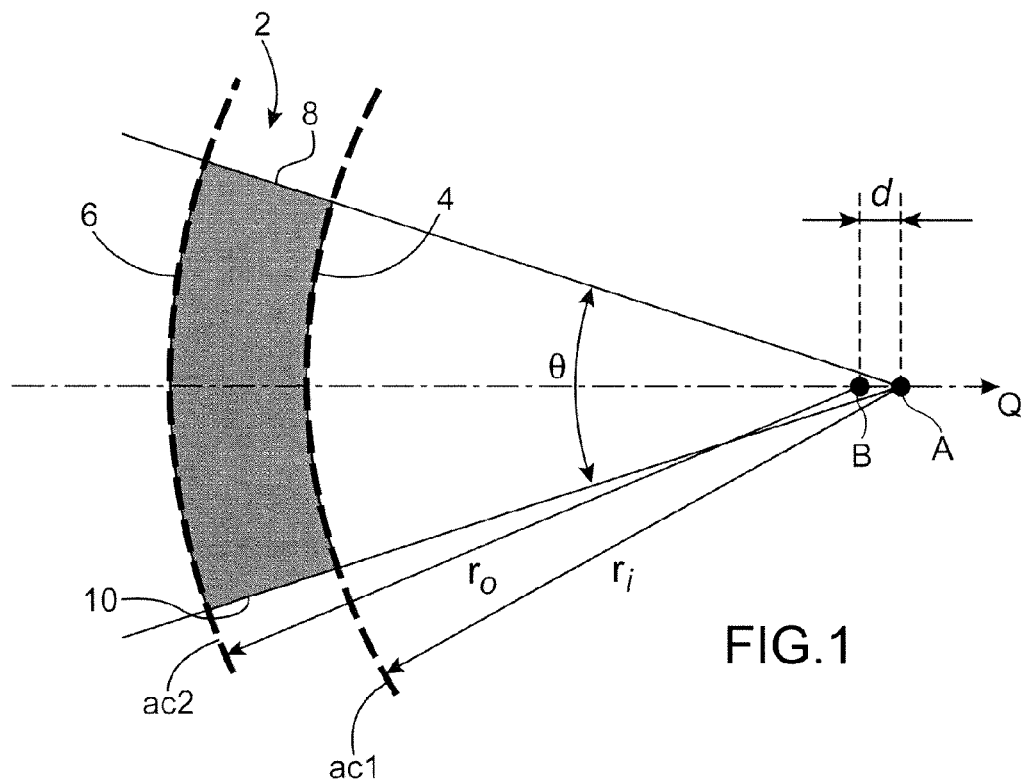
FIG. 1 is a schematic representation of an exemplary embodiment of an actuator according to the present invention.

In FIG. 1, a schematic representation of an actuator according to an exemplary embodiment designed by the reference 2 can be seen.

The actuator 2 is in the shape of a plate bounded by four sides 4, 6, 8 and 10. The side 4 forms a contact edge intended to contact the rotor. The sides 6, 8 and 10 form edges for holding said actuator in a support which will be described thereafter.

The contact edge 4 has a concave curved shape corresponding to the external outline of the rotor, and forming a cradle for the rotor.

The rotor can for example be a sphere or a revolution cylinder.

As is represented in FIG. 1, the contact edge 4 is formed by an arc of circle ac1 having a radius ri centered on the point A and angularly extending at an angle θ.

In the example represented, the edge 6 opposite to the contact edge 4 is also formed by an arc of circle ac2 having a radius ro and centered on a point B. The arc of circle ac2 also extends angularly at an angle θ. The edge 6 will be later referred to as "holding edge".

Points A and B are carried by the bisectrix of the angle θ. d is the distance between the centers A and B, i. e. the excentering between the centers of the arc of circle ac1 and ac2.

Both side edges 8 and 10 connecting the contact edge 4 and the holding edge 8 are formed by two segments.

In this exemplary embodiment, the contact edge 4 is intended to contact the rotor, the radius ri of the contact edge 4 is thus selected as a function of the rotor radius such that the contact between the rotor and the contact edge 4 is as large as possible.

An actuator wherein points A and B are the same does not depart from the scope of the present invention.

An actuator wherein the holding edge 6 would be a straight edge or of any other shape, does not depart from the scope of the present invention. Besides, the straight shape of the side edges is not limiting and they could also be of a concave or convex curved shape. It could be contemplated that the edges 6, 8 and 10 are the same.

The actuator is made of a piezoelectric material for example of lead Titano-Zirconate (PZT), Zinc Oxide (ZnO) or even Barium Titanate (BaTiO3).

Advantageously, the contact edge 4 is covered with a layer 9 of a material more ductile than the piezoelectric ceramics, avoiding the direct contact between the piezoelectric ceramics and the rotor, which reduces both the actuator wear and the rotor wear. This material is for example formed by an epoxy resin. Preferably, the rotor is therefore of aluminium, indeed the frictional torque between the aluminium and epoxy resin exhibits a good performance. The layer 9 acts to reduce the abrasive wear and absorb part of the stress.

Figure 2:
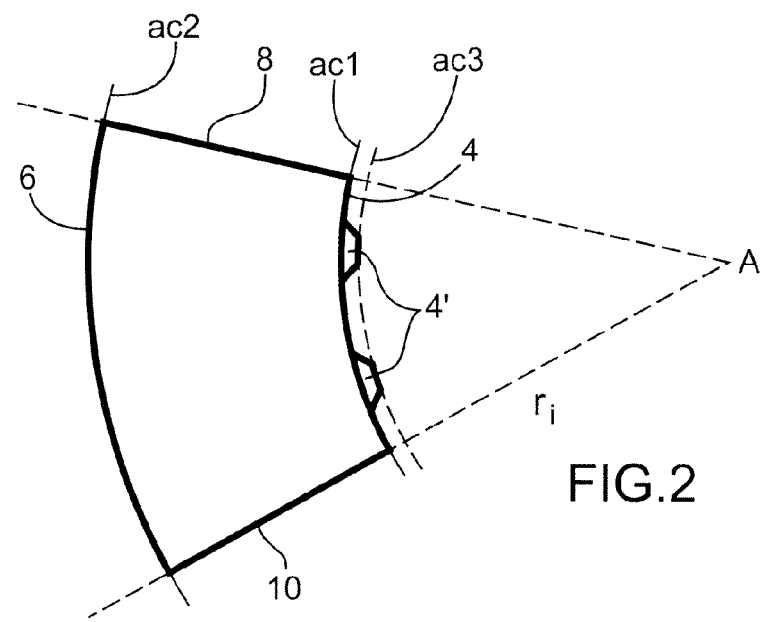
FIG. 2 is a top view of another exemplary embodiment of an actuator.

In FIG. 2A, another exemplary actuator can be seen, wherein the actuator contacts the rotor, not with its contact edge 4 directly, but with areas 4' projecting from the contact edge 4, two areas in the example represented, these areas 4' being referred to as "contact areas". The contact areas 4' are carried by an arc of circle ac3 the radius of which thus corresponds substantially to that of the rotor. The projecting contact areas 4' are advantageously made of a material similar to that of the layer 9 described above, for example of epoxy. The contact areas 4' reduce the abrasive wear and absorb part of the stress. By changing their size, the contact size between the actuator and the rotor is optimised.

The contact areas have for example a height between about 0.5 mm and 1 mm, which height corresponds to the difference between the radius of the arc of circle ac3 carrying the contact areas and ri.

The contact areas 4' extend for example on an angular portion between about 2° and the entire angle θ, i. e. the entire contact edge 4 of the actuator (FIG. 1).

One of the faces of the actuator 2 carries electrodes.

Figure 5A:
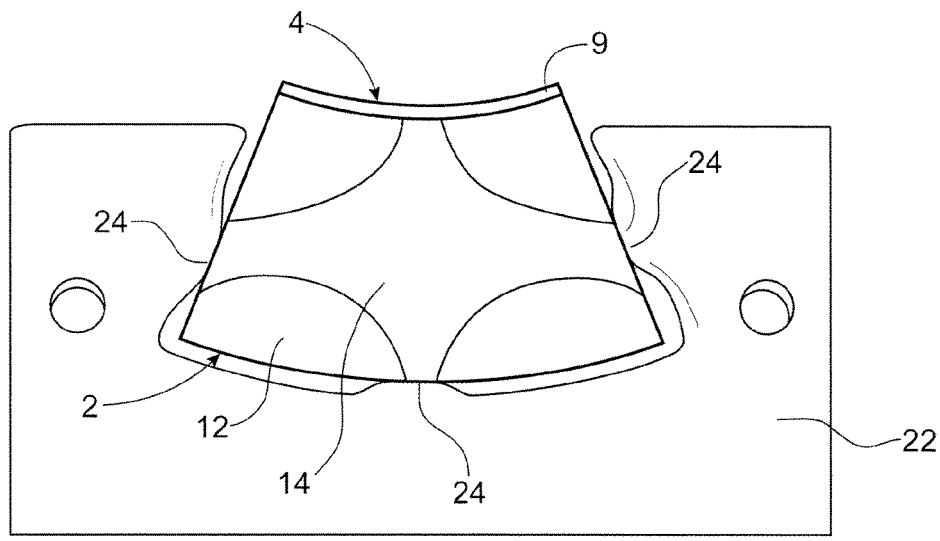
FIG. 5A is a detail view of an ultrasonic motor according to the present invention, wherein an actuator provided in its partly represented support can be seen.
Figure 5B:
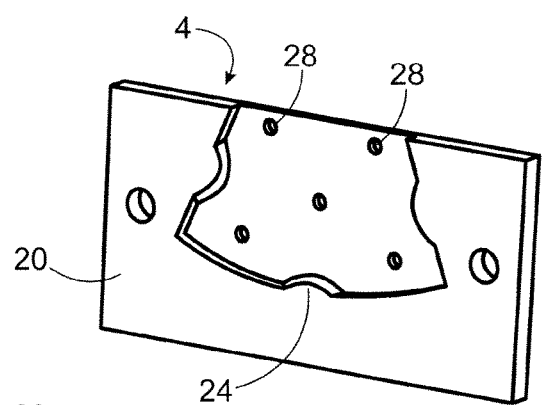
FIG. 5B is a perspective view of the motor of FIG. 5A, wherein the support is entirely represented.

In FIGS. 5A and 5B, an exemplary actuator mounted in a support and wherein the electrodes are represented can be seen. In the example represented, the actuator comprises four electrodes 12 intended to bias the actuator in a bending mode and an electrode 14 intended to bias the actuator in a longitudinal mode. The electrodes 12 are arranged substantially at the four vertices of the actuator and the electrode 14 extends between the electrodes 12 and has substantially a cross shape. The electrodes 12 are referred to as "bending electrodes" and the electrode 14 will be referred to as a "longitudinal electrode". The opposite face of the actuator can comprise a single counter-electrode or one counter-electrode for each of the electrodes of the first face. When the actuator comprises a single counter-electrode, it is connected to the ground. On the other hand, when it comprises several counter-electrodes, this can be alternately powered with a high voltage or be grounded.

This enables a symmetrical power (+/−V) to be "simulated" using an asymmetrical power (+V/ground).

The bending mode and longitudinal mode are orthogonal. In order to obtain an elliptical movement of the contact edge 4, the actuator is made such that both orthogonal modes in the same plane are at the same frequency. For this, the angle θ is selected so as to obtain both these modes at the same frequency.

Figure 8:
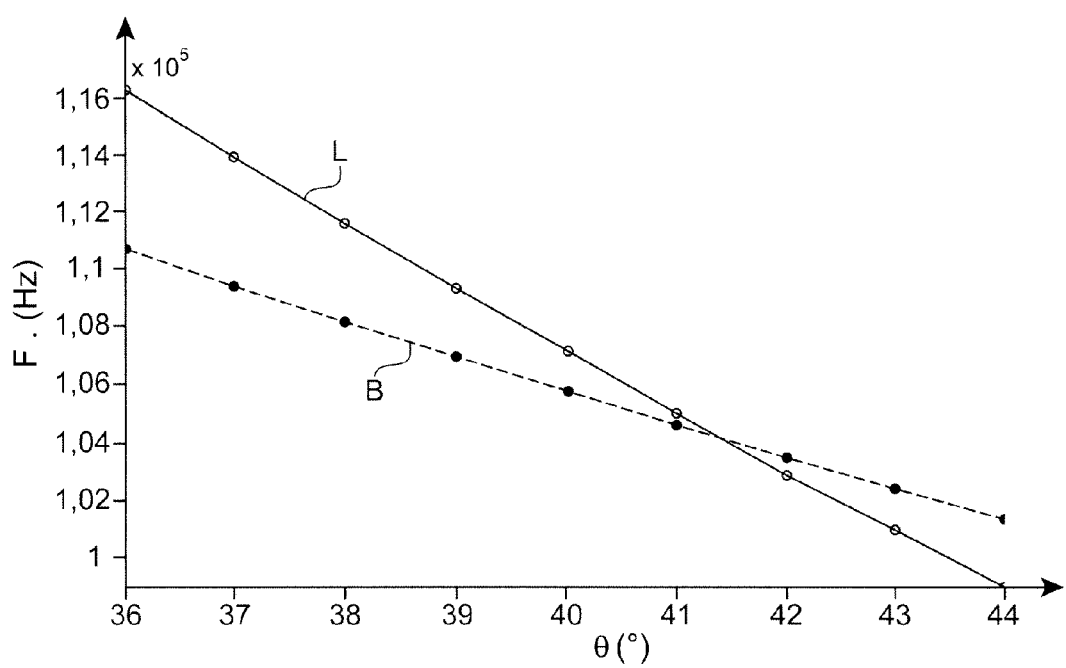
FIG. 8 is a graphic representation enabling the angle of the actuators according to the present invention to be determined.

In FIG. 8, the variation of the frequency of the longitudinal mode referred to as L as a function of the angle θ of the actuator, and the variation of the frequency of the bending mode referred to as B as a function of θ can be seen. It is observed that the variation of the frequencies L and B is linear and is intersecting at a point corresponding to a given angle, this angle therefore corresponding to the angle of an actuator having two orthogonal modes at the same frequency, it is this value that sets the angle of the actuator.

From FIG. 8, it is deduced that, for an actuator for which points A and B are the same, the radius ri is equal to 15 mm, the radius ro is equal to 25 mm, the angle θ is equal to 41.4°.

In the table below, several examples of angle θ value of an actuator according to the invention are gathered for couples of values of ro (row) and d (column) and for ri=15 mm.

|       | 20 mm   | 25 mm   | 35 mm   |
|-------|---------|---------|---------|
| 5 mm  |         | 24.89°  |         |
| 0 mm  | 54.98°  | 41.39°  | 56.54°  |
| −5 mm |         | 50.51°  |         |

The piezoelectric elements have for example a thickness between 0.2 mm and 1 mm.

Multilayer elements formed by several thin layers of piezoelectric material separated by electrodes can also be used, therefore the voltage required to operate the actuator is reduced. Indeed, when the thickness is thinner, the electrical field increases as well as the deformation. Preferably, a multilayer element is used to take advantage of the increased field effect while keeping an actuator being thick enough not to be broken.

The sign of d is considered with respect to the direction of axis Q, when B is on the right of A on the representation of FIG. 1, d is positive, and conversely when B is on the left of A as is the case in FIG. 1, d is negative.

In FIG. 3, is schematically represented an ultrasonic motor M1 with one degree of freedom comprising an actuator 2 according to the present invention. The motor comprises a cylindrical rotor 16 of axis Z. The actuator 2 is in contact through its contact edge 4 with the cylindrical outline of the rotor 16 by at least two contact points formed by the ends of the contact edge 4. The application of an A.C. voltage to the actuator so as to bias it in a longitudinal mode and a bending mode causes the rotor to rotate about the axis Z.

Figures 7A, 7B:
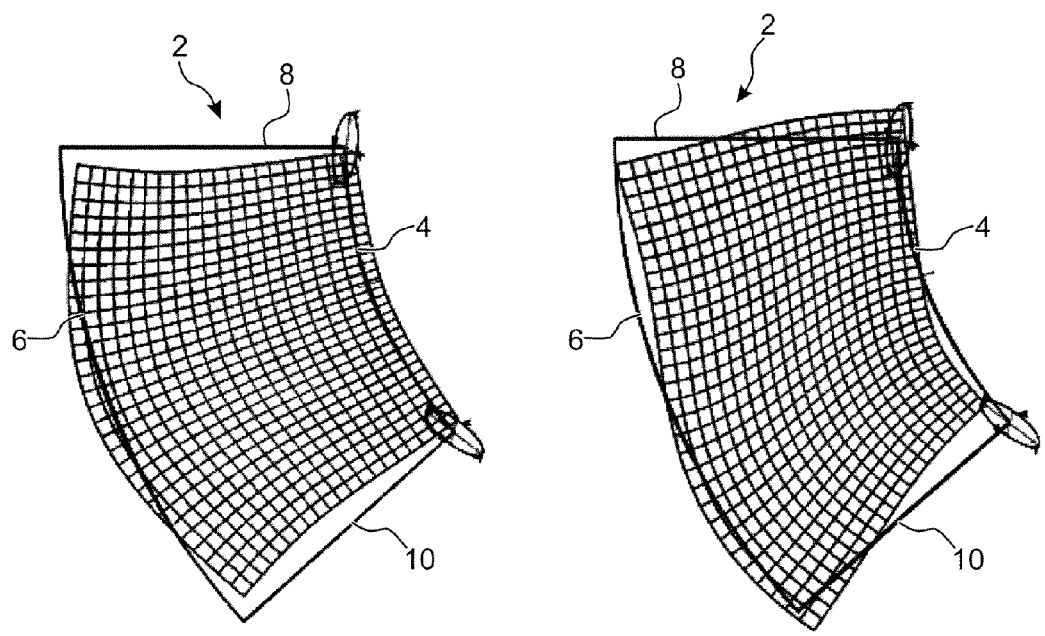
FIGS. 7A and 7B are schematic representations of an actuator according to the present invention biased in a longitudinal mode and a bending mode respectively, said representations being obtained by finite elements.

In FIGS. 7A and 7B, the modal deflected curves of the actuator according to the present invention can be seen, when a longitudinal mode (FIG. 7A) and a bending mode (FIG. 7B) are applied thereto. The actuator is stimulated in both these modes with a time phase difference enabling an elliptical movement of the contact edge to be obtained.

The ellipses drawn in FIGS. 7A and 7B correspond to a time phase shift of π/2 in the stimulation of both modes.

Further, the proximity of the modes in frequency enables the resonance effect to be benefited from in order to amplify the movements at the rotor.

In FIG. 4A, an exploded view of an exemplary embodiment of an ultrasonic motor M2 with two degrees of freedom according to the present invention can be seen. The ultrasonic motor M2 comprises a rotor 18 the surface of which intended to contact the actuators is of spherical shape, a case 20 wherein are mounted the actuators 2 and 102, and the rotor 18, and a closing plate 22 mounted to the case 20. The closing plate 22 is provided with an opening for the passage of a transmitting element for example the handle of a joystick secured to the rotor in an area opposite to that in contact with the actuators 2, 102.

As can be seen in FIGS. 4B to 4D, both actuators 2 and 102 are mounted perpendicularly to each other inside the case and in two planes perpendicular to the plane containing the axes X and Y about which the rotor 18 is intended to be rotatably driven. The rotor 18 lies on the contact edges 4 and 104. In the representation of FIGS. 4A to 4C, the axes X and Y define a horizontal plane.

To make an ultrasonic motor with three degrees of freedom, a third actuator according to the invention is provided in a plane perpendicular to that of the actuators 2, 102 with its contact edge in contact with the rotor, the latter moves the rotor about an axis Z perpendicular to the axes X and Y.

In FIG. 5A, as previously mentioned, is represented an actuator mounted in a support 22 one part of which has been withdrawn.

In FIG. 5B, the entire support is represented in transparency. The support 22 is formed by two plates wherein is formed a housing the internal shape of which substantially corresponds to the external outline of the actuator 2 formed by the side edges 8 and 10 and by the holding edge 6. The housing of the support 22 comprises means for holding the actuator avoiding vibrations from being dampened. In the example represented, these means are formed by three fulcrums 24 located so as to contact the edges 6, 8 and 10 of the actuator at the longitudinal electrode, that is at points of null bending displacement. The three fulcrums 24 are formed by bosses projecting from the walls of the support housing.

The support is for example made of Bakelite.

There are means for connecting the electrodes to an A.C. voltage source. For example, a side face (non-visible) of the support can be made of a printed circuit plate the copper layer of which is etched in order to connect the electrodes.

Figure 5C:
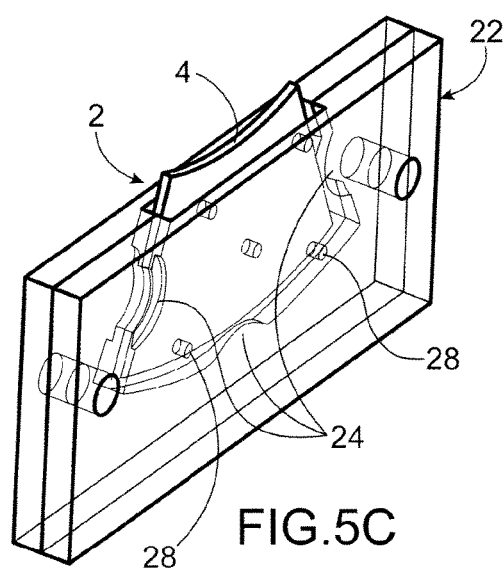
FIG. 5C is an alternative embodiment of the support and the actuator.

In FIG. 5B, one of the parts of the support made in printed circuit plates can be seen, the connecting side face of which can be seen. The pierced holes 28, visible in FIGS. 5B and 5C, enable electrical contacts with the electrodes of the actuator 2 to be set. These contacts can be made using welded wires or elastic mechanical contacts, such as springs.

In FIGS. 6A to 6D, different exemplary arrangements of the bending electrodes 12 and the longitudinal electrode 14 can be seen.

Figure 6A:
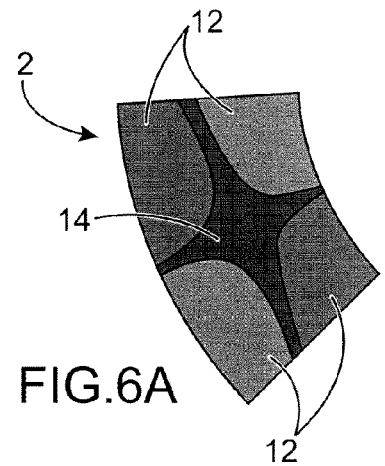
FIGS. 6A to 6D are side views of exemplary embodiments of the actuator according to the present invention, wherein the stimulating electrodes in the longitudinal mode and bending mode can be seen.
Figure 6B:
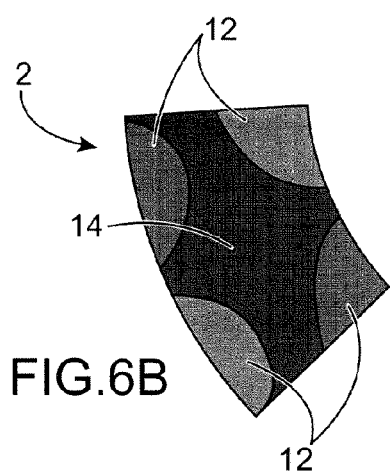
Figure 6C:
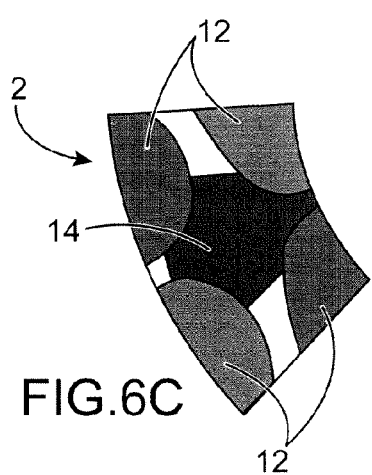

In FIGS. 6A and 6B, the longitudinal electrode extends to the edges 4, 6, 8 and 10, whereas in FIG. 6C, it only extends to the contact edge 4. These electrode shapes are particularly advantageous because they enable a coupling between both bias modes of the actuators to be avoided and enable the electrical stimulation to be optimised and thus the efficiency to be improved.

Figure 6D:
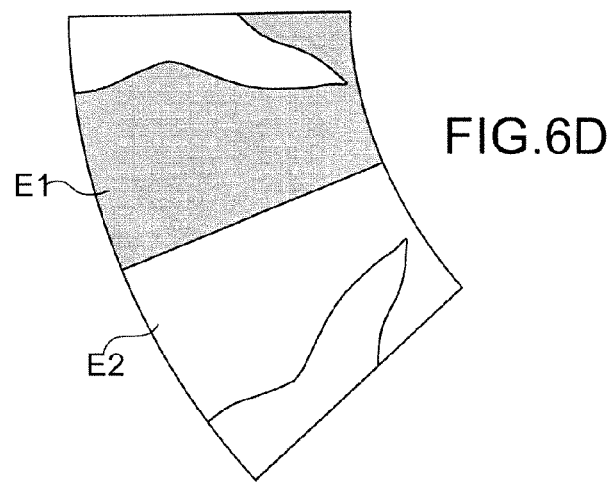

In FIG. 6D, an exemplary actuator comprising two electrodes E1, E2 with a combined stimulation can be seen. In the first electrode E1 and in the second electrode E2, the following voltages VE1 and VE2 are applied respectively:

$$VE1=VL1*\sin(wt)+VB2*\sin(wt+phi)$$

$$VE2=VL1*\sin(wt)-VB2*\sin(wt+phi)$$

With VL1 being the symmetrical excitation and VB2 the anti-symmetrical excitation.

The excitations are then combined to form a single excitation. phi is the phase shift between both modes.

By virtue of the actuator according to the present invention, a robust ultrasonic motor is obtained, since stresses are no longer localized, having a very simple design since the actuator directly forms the rotor support and having a great compactness. Besides, it has an improved efficiency since the useful part of the electrical energy transmitted to the actuator is increased thanks to the increased contact area.

This ultrasonic motor according to the present invention can be used in numerous fields, for example in the displacement of optical instruments such as cameras, lenses, lasers, micro-projectors, for inertial stabilisation and object tracking. It can also be used in hinging robots, in particular compact robots because of its reduced size, in micromanipulators, in joystick type force feedback interfaces . . . .

What is claimed is:

1. An ultrasonic motor comprising:
a stator and
a rotor, said rotor comprising:
one actuator configured to move the rotor around one axis of rotation, the actuator comprising a plate-shaped element, said element being made of piezoelectric material, said plate-shaped element comprising at least one contact edge provided with at least one contact area directly contacting the external surface of the rotor, wherein the contact edge is concave and is formed by a first arc of circle having a first radius, said first arc of circle extending angularly at a determined angle such that a bending mode and a longitudinal mode in which the piezoelectric material is biased are at the same frequency, and said at least one contact area is concave and is carried by a second arc of circle having a second radius substantially corresponding to the radius of the surface of the rotor
wherein the actuator includes:
four electrodes wherein each electrode is disposed at one of four vertices of the actuator, the four electrodes configured to bias the piezoelectric material in the bending mode, and
a cross-shaped electrode disposed between the four electrodes and configured to bias the piezoelectric material in the longitudinal mode.

2. The ultrasonic motor according to claim 1, comprising two contact areas.

3. The ultrasonic motor according to claim 1, wherein the contact area(s) is (are) projecting from the contact edge, the contact area(s) being of a material different from the piezoelectric material, said material ensuring a reduced abrasive wear of the element of piezoelectric material and the rotor.

4. The ultrasonic motor according to claim 1, wherein the first radius of the first arc of circle (ac1) forming the contact edge and the second radius of the arc of circle forming the contact area(s) are equal such that the actuator contacts the rotor through its contact edge.

5. The ultrasonic motor according to claim 4, comprising a layer covering the contact edge, of a material different from the piezoelectric material, said material providing a reduced abrasive wear of the element of piezoelectric material and of the rotor.

6. The ultrasonic motor according to claim 3, wherein the material different from the piezoelectric material providing a reduced abrasive wear of the element of piezoelectric material and of the rotor is an epoxy resin.

7. The ultrasonic motor according to claim 1, comprising three other sides, the opposite edge to the contact edge being convex and being formed by a second arc of circle.

8. The ultrasonic motor according to claim 7, wherein the first and second arcs of circle are coaxial.

9. The ultrasonic motor according to claim 1, wherein the difference between the second radius and the first radius is between 0.5 mm and 1 mm.

10. The ultrasonic motor according to claim 1, having one degree of freedom and comprising a single actuator.

11. The ultrasonic motor according to claim 1, having at least two degrees of freedom, at least two actuators and one rotor having an external surface being at least partly spherical.

12. The ultrasonic motor according to claim 1, comprising a support for each of the actuators and electrical connector for connecting the electrodes to an A. C. voltage source, each support holding the actuator at its edges other than the contact edge.

13. The ultrasonic motor according to claim 12, wherein the support comprises bosses (24) in contact with the edges of the actuator other than the contact edge at the areas of the edges of the actuator which have a null bending displacement.

14. The ultrasonic motor according to claim 1, wherein the rotor is of aluminium.

15. The ultrasonic motor according to claim 1, wherein the plate-shaped element is made of only a piezoelectric material.

16. The ultrasonic motor according to claim 1, comprising at least two actuators.

17. An ultrasonic motor comprising:
a stator,
a rotor, said rotor comprising:
one actuator configured to move the rotor around one axis of rotation, the actuator comprising a plate-shaped element, said element being made of piezoelectric material, said plate-shaped element comprising at least one contact edge provided with at least one contact area directly contacting the external surface of the rotor, electrodes configured to bias the piezoelectric material in a bending mode and in a longitudinal mode, wherein the contact edge is concave and is formed by a first arc of circle having a first radius, said first arc of circle extending angularly at a determined angle such that the bending mode and the longitudinal mode in which the piezoelectric material is biased are at the same frequency, and said at least one contact area is concave and is carried by a second arc of circle having a second radius substantially corresponding to the radius of the surface of the rotor, and
a support for holding said actuator, said support including mating plates having inner facing surfaces contoured to form an internal shape that is dimensioned to capture at least a portion of said actuator between said mating pates.

18. The ultrasonic motor according to claim 17, further comprising an electrical connector for connecting the electrodes to an A. C. voltage source.

19. The ultrasonic motor according to claim 17, wherein the internal shape includes at least one boss in contact with one edge of the actuator other than the contact edge.

20. The ultrasonic motor according to claim 17, wherein the actuator includes:
- four electrodes wherein each electrode is disposed at one of four vertices of the actuator, the four electrodes configured to bias the piezoelectric material in the bending mode, and
- a cross-shaped electrode disposed between the four electrodes and configured to bias the piezoelectric material in the longitudinal mode,
- wherein the internal shape includes at least one boss in contact with one edge of the cross-shaped electrode.

* * * * *